United States Patent [19]
Kao et al.

[11] Patent Number: 5,415,128
[45] Date of Patent: May 16, 1995

[54] ROTATION INDUCED SUPERLATTICE

[75] Inventors: Yung-Chung Kao, Dallas; Hung-Yu Lin; Alan C. Seabaugh, both of Richardson; James H. Luscombe, Dallas, all of Tex.

[73] Assignee: Texas Instruments Incorporated, Dallas, Tex.

[21] Appl. No.: 209,693

[22] Filed: Mar. 9, 1994

Related U.S. Application Data

[63] Continuation of Ser. No. 683,942, Apr. 12, 1991, abandoned.

[51] Int. Cl.⁶ .............................................. H01L 21/20
[52] U.S. Cl. ..................... 117/98; 437/105; 437/107; 437/110; 437/126; 437/128; 437/133
[58] Field of Search ............... 437/105, 107, 110, 128, 437/126, 133; 117/98

[56] References Cited

U.S. PATENT DOCUMENTS

| | | | |
|---|---|---|---|
| 4,640,720 | 2/1987 | Foxon | 437/110 |
| 4,885,260 | 12/1989 | Ban et al. | 437/110 |
| 4,983,540 | 1/1991 | Yamaguchi et al. | 437/110 |
| 5,091,335 | 2/1992 | Grunthaner et al. | 156/611 |

FOREIGN PATENT DOCUMENTS

| | | | |
|---|---|---|---|
| 0229263 | 7/1987 | European Pat. Off. | 437/107 |
| 0305195 | 3/1989 | European Pat. Off. | 437/110 |
| 60-145998 | 8/1985 | Japan | 437/107 |
| 61-181121 | 8/1986 | Japan | 437/105 |
| 61-278130 | 12/1986 | Japan | 437/105 |
| 1-278496 | 4/1989 | Japan | 156/611 |

OTHER PUBLICATIONS

Tischler et al., "Improved Uniformity of Epitaxial Indium-Based Compounds by Atomic Layer Epitaxy", 320 *Applied Physics Letters* 49(5), 4 Aug. 1986, pp. 274–276.

Katsuyama, et al, "Molecular Stream Epitaxy of Ultrathin InGaAs/GaAsP Superlattices", 320 *Applied Physics Letters* 51 (7), 17 Aug. 1987, pp. 529–531.

Seabaugh, et al., "Characterization of Unintentionally-Ordered Superlattice Resonant-Tunneling Diodes", Second International Conference on Indium Phosphide and Related Materials, Denver, Colo., Apr. 23–25, 1990.

*Primary Examiner*—R. Bruce Breneman
*Assistant Examiner*—Ramamohan Rao Paladugu
*Attorney, Agent, or Firm*—Rebecca A. Mapstone; James C. Kesterson; Richard L. Donaldson

[57] ABSTRACT

This invention describes a multi-deposition system, whereby directing elemental or molecular source fluxes across a substrate in an asymmetrical manner and rotating the substrate at low rotation speeds, a superlattice is formed having a composition of $A(x-\Delta x)B(1-(x-\Delta x))/A(x+\Delta x)B(1-(x+\Delta x))$ where $\Delta x$ is a function of the nonuniform focusing of the elemental or molecular source fluxes A and B. More specifically, superlattices 18 are formed in the ternary and quaternary In(GaAl)As alloys on InP by molecular beam epitaxy without mechanical shuttering. The superlattice 18 is formed by nonuniformly directing the group III elements 22 and 24 onto the substrate 26 and rotating the substrate 26 across the beams. Periodic ordering is produced by rotation of the substrate 26 through a nonuniform distribution of source fluxes at the rotating substrate 26. The growth rate and substrate rotation rate together determine the superlattice period.

18 Claims, 2 Drawing Sheets

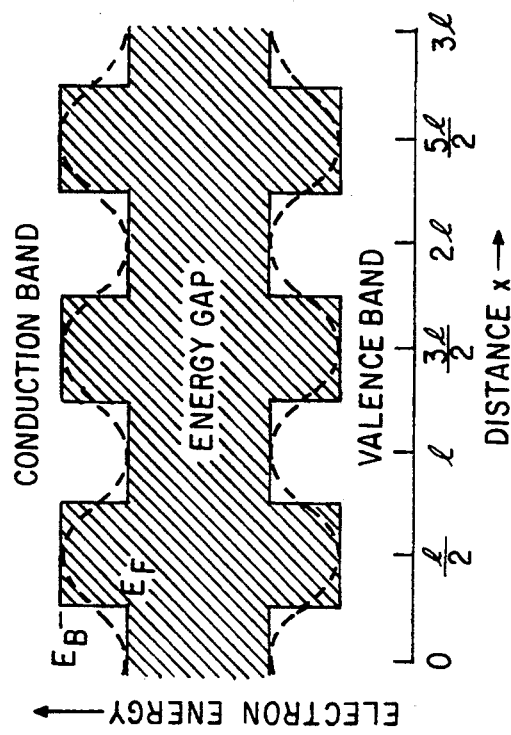
Fig.1
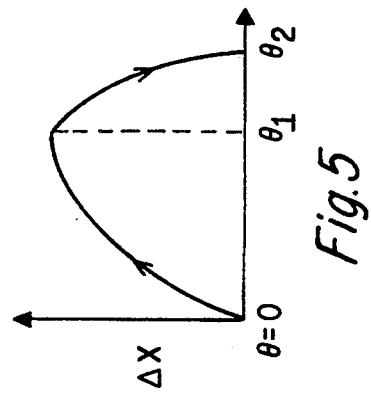
Fig.2
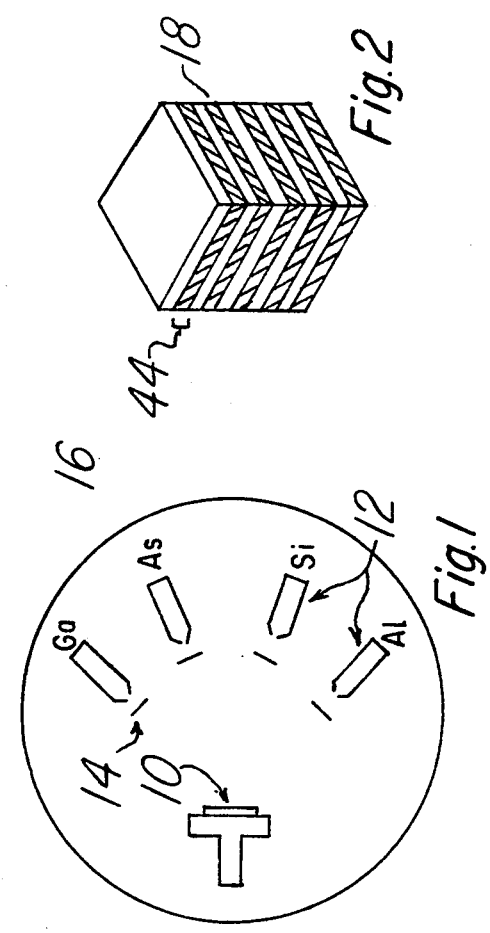
Fig.3
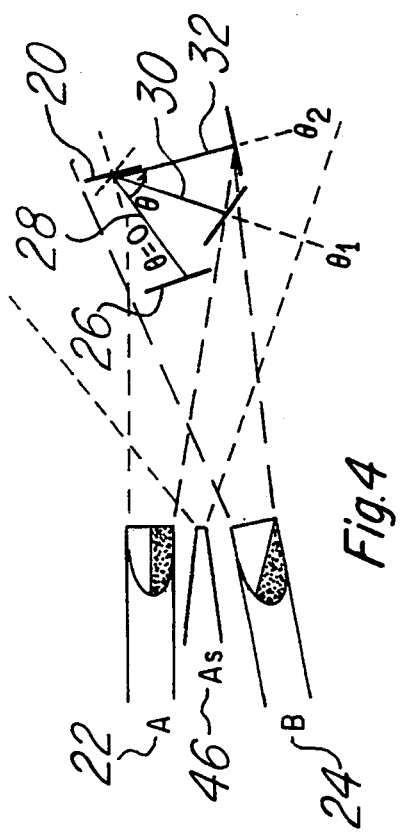
Fig.4
Fig.5

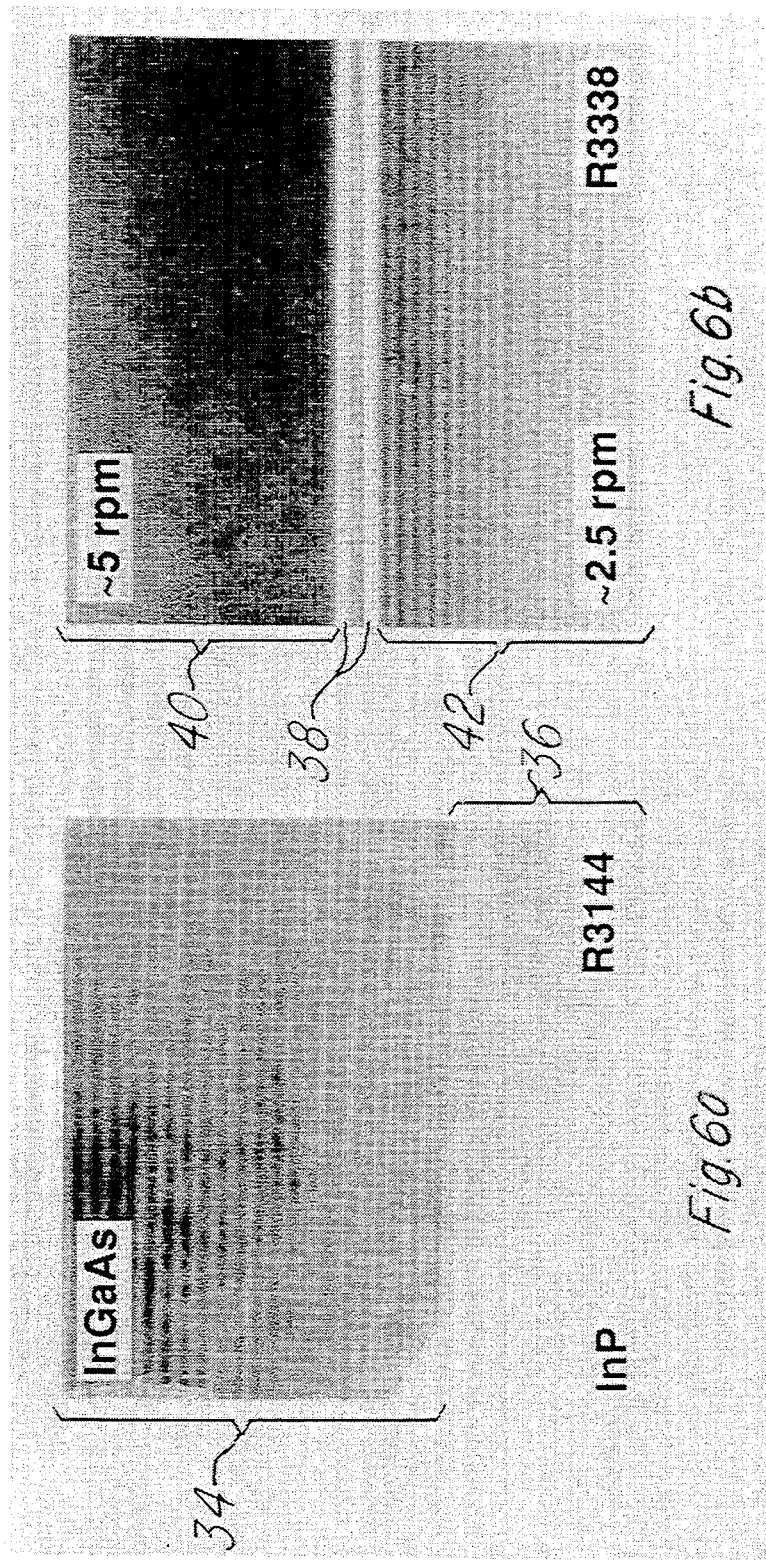

ROTATION INDUCED SUPERLATTICE

This application is a Continuation of application Ser. No. 07/863,942, filed Apr. 12, 1991, now abandoned.

This invention generally relates to the formation of rotation-induced superlattices.

BACKGROUND OF THE INVENTION

In molecular beam epitaxy (MBE), elemental source beams with cosinusoidal intensity profiles are directed across a vacuum space onto a heated substrate crystal 10. The substrate 10 is heated to provide sufficient energy for surface diffusion and incorporation of the species. The elemental source beams originate from separate ovens, often called effusion cells 12. The heated elements vaporize and exit the effusion cell 12 through one end, go past an open shutter 14, and travel through the growth chamber 16 until reaching the substrate 10. Elements may be switched on and off using the shutter 14 in front of each effusion cell 12. FIG. 1 shows a schematic diagram of the growth chamber 16 of a prior art MBE machine. To compensate for the natural inhomogeneity of the beam intensity profiles and the necessarily nonsymmetric arrangement of sources within the growth chamber 16, the beams are not centered on the circular substrate 10, rather they are focused onto an intermediate point along the substrate radius. The substrate 10 is then rotated to achieve compositional uniformity.

To ensure uniformity, the rotation rate is chosen such that less than one monolayer is grown in the time it takes for a single substrate revolution. For a growth rate of 2 A/s, compositional uniformity, both in the growth direction and radially across the substrate 10, requires rotation speeds of 60 rpm or more. However, practical considerations such as sample mounting, impurity control, and low maintenance growth procedures dictate a considerably lower substrate rotation speed, typically 2-10 rpm.

A superlattice 18, SL, is a one-dimensional periodic structure consisting of ultrathin layers 44, with its period less than the electron mean free path. A schematic of a superlattice 18 is shown in FIG. 2. These ultra-thin layers 44 differ, in a prescribed manner, by their energy gaps. As the dimensions of the period become comparable to the electron wavelength, wave properties of the charge carriers become important. The energy profile of the superlattice 18 consists of alternating energy barriers as shown in FIG. 3. Classically, an electron with energy Ef, approaching an energy barrier with an energy below the barrier energy, Eb, would be reflected, analogous to a baseball rebounding off a concrete wall or to an electromagnetic wave at the end of an open-circuited transmission line. Quantum mechanics, however, allows that as the physical dimensions of the barrier decrease toward the wavelength of the particle, there is an increasing probability that the particles will be transmitted instead of reflected. Thus under certain conditions an electron can pass through the barrier even with energy below the barrier potential. This classically-forbidden phenomena is called tunneling. Due to this phenomena, some desirable aspects of superlattices are higher mobility and, lower electron scattering rates, translating into reduced parasitic resistance, and higher current gain in vertical devices such as heterojunction bipolar transistors (HBTs) and hot electron transistors.

Superlattices 18 are obtained by a periodic variation of composition during epitaxial growth. Heretofore, in this field, superlattice structures 18 have been formed using mechanical shuttering in molecular beam epitaxy (MBE) growth. To introduce the periodic variation of composition, the elemental beam fluxes across the substrate 10 are varied by mechanically shuttering the effusion cells 12. This shuttering action, however, can cause growth transients and "shutter fatigue". Growth transients occur due to the pressure build up of the vaporized element in a closed effusion cell 12. Once the cell is opened again, a burst of atoms impinge upon the substrate 10, increasing the growth rate until the pressure has stabilized. "Shutter fatigue" occurs when the shutters 14 jam or don't open or close properly. Shutter 14 fatigue is especially common in superlattice 18 growth due to the excessive number of transitions the shutters 14 must perform to fulfill the ultra-thin and multiple layer 44 requirements.

The materials currently of interest in superlattice growth are well-known semiconductors and their alloys; for examples, Ge, Si, Ge—Si alloys, III-V compounds and their alloys, II-VI compounds and their alloys, etc. InGaAs—InAlAs pseudomorphic and lattice-matched heterojunctions on InP substrates are of particular interest for use in high-performance transistor structures such as high electron mobility transistors (HEMTs), and resonant tunneling transistors (RTTs) because of the superior electron transport properties of InGaAs and the large conduction band offset (0.52 eV obtained for the InGaAs/InAlAs heterojunction).

SUMMARY OF THE INVENTION

The broad scope of this invention is intended to include any multi-deposition system, which by directing the elemental or molecular source fluxes across a substrate in an asymmetrical manner and rotating the substrate at low rotation speeds, forms a superlattice having a composition of $A(x-\Delta x)B(1-(x-\Delta x))/A(x+\Delta x)B(-1(x+\Delta x))$ where $\Delta x$ is a function of the nonuniform focusing of the elemental or molecular source fluxes A and B.

More specifically, shutter fatigue and transient growth have been problems in the MBE formation of superlattices 18. As a preferred embodiment, this invention describes an MBE method of forming a superlattice 18 structure without the use of shutters 14. This method is illustrated using a ternary and quaternary In(GaAl)As alloy on InP. By focusing the elemental beams 22 and 24 in a nonuniform manner across the substrate 26, a superlattice 18 is formed having a composition of $A(x-\Delta x)B(1-(x-\Delta x))As/A(x+\Delta x)B(1-(x+\Delta x))As$ where $\Delta x$ is a function of the nonuniform focusing of the elemental beams A 22 and B 24, and, formation is obtained by rotating the substrate 26 at low rotation speeds.

BRIEF DESCRIPTION OF THE DRAWINGS

In the drawings:

FIG. 1 is a prior art schematic diagram of a molecular beam epitaxy system 16.

FIG. 2 is a schematic diagram of a superlattice structure 18.

FIG. 3 is an energy diagram of the forbidden and allowed energy zones in the conduction band of a superlattice.

FIG. 4 is a schematic of the present invention wherein the substrate 26, relative to the flux distribution in the MBE chamber, is rotated away from the uniform growth position 28.

FIG. 5 is a plot of the relationship between the compositional change in a superlattice 18 versus the substrate's 26 angle of departure from a uniform growth position 28 resulting from the use of this invention.

FIG. 6a is a cross-sectional view of a lattice-matched, nominally In0.53Ga0.47As SL layer grown on an InP substrate using the method of this invention.

FIG. 6b is a cross-sectional view of a superlattice grown at a rotation rate of 2.5 rpm, a resonant tunneling diode structure, and a superlattice grown at a rotation rate of 5 rpm using the method of this invention.

Corresponding numerals and symbols in the different figures refer to corresponding parts unless otherwise indicated.

DETAILED DESCRIPTION OF PREFERRED EMBODIMENTS

At low rotation speeds, 2-5 rpm, and typical growth rates of 1-3 A/s, the layer composition in the grown film of the rotation-induced superlattice can be readily formed in conventional MBE systems. In the present invention, it's shown that the alloy composition variation is sufficient to form electrically active rotation-induced superlattices (SLs). As an example consider the growth of the ternary alloy In0.53Ga0.47As. If the intensities of the Ga and In beam profiles do not coincide, then the layer composition is alternatively In rich and Ga rich as the substrate is rotated through the nonuniform beams. Given a sufficient compositional variation, a strained layer /SL/ is formed with a period equal to the layer thickness grown per substrate revolution. In this way, a rotation-induced superlattice is created with MBE without mechanical shuttering. In addition, superlattices may be formed using any other codeposition system, whereby at least two elemental sources are directed across the substrate. Another example of a codeposition system is a chemical beam epitaxy system. Further, alternative metallorganic chemical vapor deposition (MOCVD) or other vapor, liquid, or gas growth method can be used to form rotation-induced superlattices. In the preferred embodiment, depicted in FIG. 4, the growth system used is an MBE system (Riber-2300). Conventional thermal group III sources 22 and 24 and an As4 source 46 are used for InGaAs and AlAs growth on InP substrates 26. The nominal growth temperature for InGaAs and AlAs is 460 C. and 510 C., respectively, with V/III flux ratio of typically 2 to 3. Substrate rotation speeds are between 2 and 5 rpm.

Once the InP substrate 26 is mounted, the substrate is tilted away from the normal MBE-uniform growth position 28 (near the co-focus point of all effusion cells 22 and 24) such that all molecular beams focus at some point away from the substrate 26. Leaving all effusion cells 22 and 24 open, the substrate 26 is rotated slowly(-2-5 rpm). The nonuniform distribution of beam fluxes at the rotating substrate 26 causes an ordering in the direction of growth with an ordering period determined by the product of growth rate and substrate rotation period. The effect of the ordering is to produce a strained layer SL 18 whose properties can be inferred from the current-voltage characteristics of resonant tunneling diodes. This strained layer superlattice has a pseudomorphic composition given by In(0.53−$\Delta$x)Ga(0.47+$\Delta$x)As/In(0.53+$\Delta$x)Ga(0.47−$\Delta$x)As, whereby $\Delta$x is the difference in the maximum and minimum composition obtained in a single revolution.

In(0.53)Ga(0.47)As is the composition corresponding to a lattice matching with InP. The compositional variation $\Delta$x is determined by the angle of the substrate holder with respect to the uniform growth position. FIG. 4 shows the substrate 26 relative to the flux distribution of the elemental sources A 22 and B 24 in the MBE chamber as the substrate 26 is rotated from the uniform growth position 28, $\theta = 0$, to a nonuniform flux distribution position $\theta > 0$. As is illustrated in FIG. 5, as the substrate 26 is swung away from the growth dead center position 28, $\theta = 0$, there is a maximum composition difference at $\theta = \theta 1$, position 30. As the substrate 26 is swung yet further away from dead center position 28, the growth rate and the composition difference drops rapidly until there is no growth at $\theta = \theta 2$, position 32. As this flux distribution is varied, the composition can be controlled and the superlattice performance can be uniquely defined for any application.

In the growth of the ternary and quaternary In(GaAl)As strained-layer SLs on InP, the period of the SL is determined by the layer thickness grown per substrate revolution. In FIG. 6 transmission electron microscopy (TEM) images of two such SLs are shown. A lattice-matched, nominally In0.53Ga0.47As layer grown on an InP substrate is shown in FIG. 6a. Clear ordering of the InGaAs layer 34 is seen with an ordering period of 5.4 nm, while in the lower portion of the figure the uniform InP substrate 36 composition is apparent. The ability to control the SL period is demonstrated in FIG. 6b where, in the growth of a resonant tunneling diode structure, the rotation rate is doubled upon initiation of the resonant tunneling double-barrier growth. The layer structure for the RTD is nominally 2/1/2/1/2 nm AlAs/In0.53Ga0.47As/InAs/In0.53Ga0–47As/AlAs; the light regions are the pseudomorphic AlAs tunneling barriers 38. A doubling of the SL period is apparent as the rotation rate is switched from 5 rpm 40 to 2.5 rpm 42. Resonant tunneling diodes (RTDs) are often formed in superlattices to enhance the electrical performance of the devices. The effect of the rotation-induced SL on the transport properties of RTDs is to alter the conductance of the device over a narrow voltage range before or after the RTD transmission resonances. This phenomenon was observed in many RTDs before the origin of the effect was determined.

When metals such as Cu, Ni, Cr, etc. are used as elemental sources instead of semiconductors, the same method of asymmetrically directing the source flux across the face of the substrate forms metal superlattice binary or ternary films also known as composition modulated films. Like semiconductor superlattices, the thickness of the composition modulated film layer is defined by the rotational speed and the growth rate. Composition modulated films result in a very finely dispersed structure that enhance the properties, for example, the mechanical strength, of a material.

A few preferred embodiments have been described in detail hereinabove. It is to be understood that the scope of the invention also comprehends embodiments different from those described, yet within the scope of the claims.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a superlattice structure having a layer thickness, comprising the steps of:
   mounting a substrate in a multi-deposition system on a rotating stage at a 90° angle with respect to the axis of rotation;
   providing individual elemental or molecular sources having growth rates;
   directing the elemental or molecular source fluxes in an asymmetric manner across the substrate to form a superlattice having a composition of $A(x-\Delta x)B(1-(x-\Delta x))/A(x+\Delta x)B(1-(x+\Delta x))$ wherein $(x+\Delta x)$ and $(x-\Delta x) > 1$ and $> 0$, and $\Delta x$ is a function of the inherent nonuniform focusing of the elemental or molecular sources, A and B, which results from one edge of the substrate being closer to a source than the other; and,
   rotating the substrate at a rotation speed such that the product of the rotation period times the source growth rate gives the selected layer thickness per superlattice period.

2. The method of claim 1, wherein said superlattice is comprised of ternary alloys and has a composition of $A(x-\Delta x)B(1-(x-\Delta x))C/A(x+\Delta x)B(1-(x+\Delta x))C$, where C is selected from the group consisting of As, P, and Sb and is a constant.

3. The method of claim 1, wherein said superlattice is comprised of quaternary or multiconstituent in composition and produced by rotation through asymmetric source fluxes.

4. The method of claim 1, wherein said multi-depositional system is a molecular beam epitaxy system.

5. The method of claim 1, further comprising the steps of:
   providing effusion cells;
   providing said individual elemental or molecular sources in said effusion cells; and,
   heating the effusion cells until the sources vaporize.

6. The method of claim 1, wherein said multi-depositional system is a chemical beam epitaxy system.

7. The method of claim 1, wherein said multi-depositional system is a gas source epitaxy system.

8. The method of claim 1, wherein said substrate is selected from the group consisting of Si, InP, GaAs, CdTe, GaSb, and AlSb.

9. The method of claim 2, wherein said individual elemental or molecular sources are selected from group III elements.

10. The method of claim 2, wherein said ternary alloy consists of As and two of the three elements Ga, In and Al.

11. The method of claim 1, wherein said rotation speed is between about 1-5 rpm and growth rate is 1-2 Angstroms/second.

12. The method of claim 1, wherein for a semiconductor superlattice, said product of the rotation period times the growth rate is of the order of the electron wavelength.

13. The method of claim 1, wherein said individual elemental or molecular sources are selected from group IV elements.

14. The method of claim 1, wherein said individual elemental or molecular sources are selected from group II and group VI.

15. The method of claim 1, wherein said focusing said elemental or molecular source fluxes in an asymmetric manner comprises offsetting the elemental or molecular sources from a co-focus position.

16. The method of claim 1, wherein said focusing said elemental or molecular source fluxes in an asymmetric manner comprises tilting the sample away from a co-focus point of all elemental or molecular sources.

17. The method of claim 2, wherein said $A(x-\Delta x)B(1-(x-\Delta x))C/A(x+\Delta x)B(1-(x+\Delta x)C$ is $In(0.53-\Delta x)Ga(0.47+\Delta x)As/In(0.53+\Delta x)Ga(0.47-\Delta x)As$.

18. The method of claim 1, wherein x is the lattice matched composition.

* * * * *